hed, in, US011155711B2

(12) United States Patent
Kadlec et al.

(10) Patent No.: US 11,155,711 B2
(45) Date of Patent: Oct. 26, 2021

(54) COMPOSITION, LIGHT DIFFUSER AND DEVICE FORMED THEREBY, AND RELATED METHODS

(71) Applicant: DOW SILICONES CORPORATION, Midland, MI (US)

(72) Inventors: Donald Anthony Kadlec, Midland, MI (US); Thomas Seldrum, Ath (BE); Kevin Van Tiggelen, Walhain-Saint-Paul (BE)

(73) Assignee: Dow Silicones Corporation, Midland, MI (US)

( * ) Notice: Subject to any disclaimer, the term of this patent is extended or adjusted under 35 U.S.C. 154(b) by 243 days.

(21) Appl. No.: 16/467,793

(22) PCT Filed: Dec. 8, 2017

(86) PCT No.: PCT/US2017/065292
§ 371 (c)(1),
(2) Date: Jun. 7, 2019

(87) PCT Pub. No.: WO2018/107021
PCT Pub. Date: Jun. 14, 2018

(65) Prior Publication Data
US 2019/0322868 A1 Oct. 24, 2019

Related U.S. Application Data

(60) Provisional application No. 62/432,041, filed on Dec. 9, 2016.

(51) Int. Cl.
*C08L 83/04* (2006.01)
*F21V 3/06* (2018.01)
*C08G 77/12* (2006.01)
*C08G 77/20* (2006.01)
*C08G 77/00* (2006.01)

(52) U.S. Cl.
CPC ............ *C08L 83/04* (2013.01); *F21V 3/0625* (2018.02); *C08G 77/12* (2013.01); *C08G 77/20* (2013.01); *C08G 77/70* (2013.01); *C08G 77/80* (2013.01); *C08L 2205/025* (2013.01); *C08L 2205/035* (2013.01)

(58) Field of Classification Search
CPC ... C08L 2205/025; C08L 83/04; C08G 77/12; C08G 77/20; C08G 77/80; C09D 183/04; F21V 3/0625
See application file for complete search history.

(56) References Cited

U.S. PATENT DOCUMENTS

| | | | |
|---|---|---|---|
| 5,932,342 | A | 8/1999 | Zeira et al. |
| 6,881,473 | B2 | 4/2005 | Takahashi et al. |
| 8,035,122 | B2 | 10/2011 | Kim et al. |
| 8,373,185 | B2 | 2/2013 | Kumei et al. |
| 8,524,833 | B2 | 9/2013 | Sim et al. |
| 9,944,759 | B2 | 4/2018 | Hayashi et al. |
| 2004/0234724 | A1 | 11/2004 | Kaminsky et al. |
| 2008/0262158 | A1 | 10/2008 | Morita et al. |
| 2014/0350194 | A1 | 11/2014 | Ko et al. |

FOREIGN PATENT DOCUMENTS

| | | | |
|---|---|---|---|
| EP | 3103842 | A1 | 12/2016 |
| JP | 2006063092 | A | 3/2006 |
| KR | 10693463 | B1 | 3/2007 |
| WO | 2014002919 | * | 1/2014 |
| WO | 2014002919 | A1 | 1/2014 |
| WO | 2014126265 | A1 | 8/2014 |
| WO | 2015034029 | A1 | 3/2015 |
| WO | 2015059258 | A1 | 4/2015 |
| WO | 2015119226 | A1 | 8/2015 |

OTHER PUBLICATIONS

International Search Report for PCT/US2017/065292 dated Mar. 28, 2018, 5 pages.

* cited by examiner

*Primary Examiner* — Kuo Liang Peng
(74) *Attorney, Agent, or Firm* — Warner Norcross + Judd LLP

(57) ABSTRACT

A composition is disclosed, which comprises (I) an aryl component; (II) a methyl component; and (III) a hydrosilylation catalyst. The (I) aryl component comprises (A) an organopolysiloxane and (B) an organohydrogenpolysiloxane. Similarly, the (II) methyl component comprises (A) an organopolysiloxane and (B) an organohydrogenpolysiloxane. A method of preparing the composition is also disclosed. Further, a method of preparing an article, e.g. a light diffuser, and a lighting device comprising the light diffuser are disclosed. Finally, a method of diffusely transmitting light with the light diffuser is disclosed.

14 Claims, No Drawings

COMPOSITION, LIGHT DIFFUSER AND DEVICE FORMED THEREBY, AND RELATED METHODS

CROSS-REFERENCE TO RELATED APPLICATIONS

This application is the National Stage of International Application No. PCT/US2017/065292 filed on Dec. 8, 2017, which claims priority to and all advantages of U.S. Provisional Patent Application No. 62/432,041 filed on Dec. 9, 2016, the content of which is hereby incorporated by reference.

FIELD OF THE INVENTION

The present invention generally relates to a composition and, more specifically, to a composition which forms articles having excellent physical properties and to related methods, articles, and light devices.

DESCRIPTION OF THE RELATED ART

Diffusive articles are known in the art and are utilized in various applications and end uses. For example, many optical device applications, such as light diffusers and lighting devices, rely upon diffusive articles for guiding, reflecting and/or diffusing light.

One attempt to minimize costs associated with diffusive articles involves utilizing a polymeric material with sufficiently high loadings of fillers, such as titanium oxide. Another attempt involves texturing surfaces of diffusive articles to diffusely transmit light. However, these approaches introduce additional processing steps and cost, and impact other performance properties.

SUMMARY OF THE INVENTION

The present invention provides a composition. The composition comprises (I) an aryl component, comprising (A) an organopolysiloxane having the following average formula:

$$R_a SiO_{(4-a)/2}$$

wherein each R is an independently selected substituted or unsubstituted hydrocarbyl group with the proviso that in one molecule, at least two of R include ethylenic unsaturation and at least 20 mole percent (%) of all R groups are aryl groups, and wherein a is selected such that 0.5≤a≤2.2. The (I) aryl component of the composition further comprises (B) an organohydrogenpolysiloxane having the following average formula:

$$R^1_b H_c SiO_{(4-b-c)/2}$$

wherein each $R^1$ is an independently selected substituted or unsubstituted hydrocarbyl group free from ethylenic unsaturation, with the proviso that in one molecule, at least 5 mole percent (%) of all $R^1$ groups are aryl groups, and b and c are selected such that 1.0<b<2.2; 0.002<c<1; and 1.0<b+c<3.0. Components (I)(A) and (I)(B) are present in the aryl component in an amount to provide a mole ratio of silicon-bonded hydrogen atoms in component (I)(B) to ethylenically unsaturated groups in component (I)(A) of from 0.3 to 5. The composition further comprises (II) a methyl component, comprising (A) an organopolysiloxane having the following average formula:

$$R^2_d SiO_{(4-d)/2}$$

wherein each $R^2$ is an independently selected substituted or unsubstituted hydrocarbyl group with the proviso that in one molecule, at least two of $R^2$ include ethylenic unsaturation and at least 20 mole percent (%) of all $R^2$ groups are methyl groups, and wherein d is selected such that 0.5≥d≥2.2. The (II) methyl component of the composition further comprises (B) an organohydrogenpolysiloxane having the following average formula:

$$R^3_e H_f SiO_{(4-e-f)/2}$$

wherein each $R^3$ is an independently selected substituted or unsubstituted hydrocarbyl group free from ethylenic unsaturation with the proviso that in one molecule, at least 20 mole percent (%) of all $R^3$ groups are methyl groups, and e and f are selected such that 1.0<e<2.2; 0.002<f<1; and 1.0<e+f<3.0. Components (II)(A) and (II)(B) are present in the methyl component in an amount to provide a mole ratio of silicon-bonded hydrogen atoms in (II)(B) to ethylenically unsaturated groups in (II)(A) of from 0.3 to 5. Finally, the composition comprises (III) a hydrosilylation catalyst. Component (I) is present in the composition in an amount of from 0.15 to 21.0 weight percent based on the total weight of components (I) and (II).

A method of preparing the composition is also disclosed. This method comprises combining components (I)(A), (I)(B), (II)(A), (II)(B), and (III) to give the composition.

The present invention also provides a method of forming an article with the composition. This method comprises disposing the composition on a substrate the give a deposit. This method further comprises curing the deposit on the substrate to give the article. The article formed in accordance with this method is also provided. The article may be, for example, a light diffuser.

A lighting device comprising the light diffuser formed from the composition is also provided, along with a method of diffusely transmitting light therewith. This method comprises exposing the light diffuser to light, thereby diffusing transmitted light.

DETAILED DESCRIPTION OF THE INVENTION

The present invention provides a composition and a method of preparing the composition. The composition has excellent properties, particularly when cured to give a cured product, including diffusing transmitted light. Thus, the present invention also provides an article, e.g. a light diffuser, formed from the composition. A lighting device and a method of using the lighting device are also provided. However, end-use applications of the composition are not limited to light diffusers or light devices. For example, the composition may be utilized as an encapsulant, may be utilized to form articles other than light diffusers, etc.

The composition comprises (I) an aryl component. The (I) aryl component comprises (A) an organopolysiloxane having the following average formula:

$$R_a SiO_{(4-a)/2}$$

wherein each R is an independently selected substituted or unsubstituted hydrocarbyl group with the proviso that in one molecule, at least two of R include ethylenic unsaturation and at least 20 mole percent (%) of all R groups are aryl groups, and wherein a is selected such that 0.5≤a≤2.2. The (I)(A) organopolysiloxane may have a linear, partially branched linear, branched, or a three-dimensional network molecular structure.

Each R is independently selected and may be linear, branched, cyclic, or combinations thereof. Cyclic hydrocarbyl groups encompass aryl groups as well as saturated or non-conjugated cyclic groups. Aryl groups may be monocyclic or polycyclic. Linear and branched hydrocarbyl groups may independently be saturated or unsaturated. One example of a combination of a linear and cyclic hydrocarbyl group is an aralkyl group. By "substituted," it is meant that one or more hydrogen atoms may be replaced with atoms other than hydrogen (e.g. a halogen atom, such as chlorine, fluorine, bromine, etc.), or a carbon atom within the chain of R may be replaced with an atom other than carbon, i.e., R may include one or more heteroatoms within the chain, such as oxygen, sulfur, nitrogen, etc. Such a group may be exemplified by methyl, ethyl, propyl, isopropyl, butyl, isobutyl, t-butyl, pentyl, hexyl, cyclohexyl, heptyl, octyl, nonyl, decyl, or a similar alkyl group; vinyl, allyl, propenyl, isopropenyl, butenyl, isobutenyl, pentenyl, heptenyl, hexenyl, cyclohexenyl group, or a similar alkenyl group; phenyl, tolyl, xylyl, naphthyl, or a similar aryl group; a benzyl, phenethyl, or a similar aralkyl group; and 3-chloropropyl, 2-bromoethyl, 3,3,3-trifluoropropyl, or a similar substituted (e.g. halogenated) alkyl group.

In one molecule, at least two of R include ethylenic unsaturation. The ethylenic unsaturation is typically terminal in R. Typically, the R including ethylenic unsaturation is independently selected from an alkenyl group and an alkynl group. "Alkenyl" means an acyclic, branched or unbranched, monovalent hydrocarbon group having one or more carbon-carbon double bonds. Alkenyl is exemplified by, but not limited to, vinyl, allyl, propenyl, and hexenyl. Alkenyl groups may have 2 to 30 carbon atoms, alternatively 2 to 24 carbon atoms, alternatively 2 to 20 carbon atoms, alternatively 2 to 12 carbon atoms, alternatively 2 to 10 carbon atoms, and alternatively 2 to 6 carbon atoms. Specific examples thereof include vinyl groups, allyl groups, and hexenyl groups. "Alkynyl" means an acyclic, branched or unbranched, monovalent hydrocarbon group having one or more carbon-carbon triple bonds. Alkynyl is exemplified by, but not limited to, ethynyl, propynyl, and butynyl. Alkynyl groups may have 2 to 30 carbon atoms, alternatively 2 to 24 carbon atoms, alternatively 2 to 20 carbon atoms, alternatively 2 to 12 carbon atoms, alternatively 2 to 10 carbon atoms, and alternatively 2 to 6 carbon atoms.

In component (I)(A), at least 20, at least 25, at least 35, at least 40, at least 45, at least 50, at least 55, at least 60, at least 65, at least 70, or at least 75, mole percent (%) of all R groups are aryl groups.

In specific embodiments, component (I)(A) comprises a mixture, comprising: (A)(i) a substantially linear organopolysiloxane and (A)(ii) a resinous organopolysiloxane.

The (A)(i) substantially linear organopolysiloxane has average formula:

$$R_a SiO_{(4-a')/2}$$

wherein each R and its provisos are defined above, and wherein a' is selected such that 1.9≤a'≤2.2.

The (A)(i) substantially linear organopolysiloxane has a linear, partially branched linear, or a branched molecular structure. At a temperature of 25° C., the (A)(i) substantially linear organopolysiloxane is typically a flowable liquid or is in the form of an uncured rubber. Generally, the (A)(i) substantially linear organopolysiloxane has a viscosity of from 10 to 10,000,000 mPa·s, alternatively from 100 to 1,000,000 mPa·s, alternatively from 100 to 100,000 mPa·s at 25° C. Viscosity may be measured at 25° C. via a Brookfield LV DV-E viscosimeter, as understood in the art.

The (A)(i) substantially linear organopolysiloxane can be exemplified by a methylphenylpolysiloxane capped at both molecular terminals with dimethylvinylsiloxy groups, a diphenylpolysiloxane capped at both molecular terminals with dimethylvinylsiloxy groups, a copolymer of a methylphenylsiloxane and dimethylsiloxane capped at both molecular terminals with dimethylvinylsiloxy groups, a copolymer of a methylvinylsiloxane and a methylphenylsiloxane capped at both molecular terminals with dimethylvinylsiloxy groups, a copolymer of a methylvinylsiloxane and diphenylsiloxane capped at both molecular terminals with dimethylvinylsiloxy groups, a copolymer of a methylvinylsiloxane, methylphenylsiloxane, and dimethylsiloxane capped at both molecular terminals with dimethylvinylsiloxy groups, a copolymer of a methylvinylsiloxane and a methylphenylsiloxane capped at both molecular terminals with trimethylsiloxy groups, a copolymer of a methylvinylsiloxane and diphenylsiloxane capped at both molecular terminals with trimethylsiloxy groups, and a copolymer of a methylvinylsiloxane, methylphenylsiloxane, and a dimethylsiloxane capped at both molecular terminals with trimethylsiloxy groups.

The (A)(ii) resinous organopolysiloxane has average formula $$R_{a''} SiO_{(4-a'')/2}$$

wherein each R and its provisos are defined above, and wherein a" is selected such that 0.5≤a"≤1.7.

The (A)(ii) resinous organopolysiloxane has a branched or a three dimensional network molecular structure. At 25° C., The (A)(ii) resinous organopolysiloxane may be in a liquid or in a solid form. The (A)(ii) resinous organopolysiloxane may comprise the following siloxy units: $R_3SiO_{1/2}$ units (i.e., M units); $R_2SiO_{2/2}$ units (i.e., D units), $RSiO_{3/2}$ units (i.e., T units) and/or $SiO_{4/2}$ units (i.e., Q units).

In specific embodiments, the (A)(ii) resinous organopolysiloxane may be exemplified by an organopolysiloxane that comprises only T units, an organopolysiloxane that comprises T units in combination with other siloxy units, or an organopolysiloxane comprising Q units in combination with other siloxy units. Typically, the (A)(ii) resinous organopolysiloxane comprises T and/or Q units. A specific example of the (A)(ii) resinous organopolysiloxane is a vinyl-terminated phenyl silsesquioxane.

When component (I)(A) comprises a mixture of the (A)(i) substantially linear organopolysiloxane and the (A)(ii) resinous organopolysiloxane, the (A)(i) substantially linear organopolysiloxane is typically present in the mixture in an amount of from 30 to 99, alternatively from 40 to 90, mass percent (%) based on the total weight of the mixture. In these embodiments, the mixture comprises the (A)(ii) resinous organopolysiloxane in an amount of from 1 to 70, alternatively from 10 to 60, mass percent (%).

The (I) aryl component further comprises (B) an organohydrogenpolysiloxane having the following average formula:

$$R^1_b H_c SiO_{(4-b-c)/2}$$

wherein each $R^1$ is an independently selected substituted or unsubstituted hydrocarbyl group free from ethylenic unsaturation with the proviso that in one molecule, at least 5 mole percent (%) of all $R^1$ groups are aryl groups, and b and c are selected such that 1.0<b<2.2; 0.002<c<1; and 1.0<b+c<3.0. In certain embodiments, 0.02<c<1.

$R^1$ may be any of the substituted or unsubstituted hydrocarbyl groups set forth above for R, with the exception of those examples of R which include ethylenic unsaturation (i.e., alkenyl and alkynyl groups). Specific examples of $R^1$ include methyl, ethyl, propyl, isopropyl, butyl, isobutyl, t-butyl, pentyl, hexyl, cyclohexyl, heptyl, octyl, nonyl, decyl, or a similar alkyl group; a phenyl, tolyl, xylyl, naphthyl, or a similar aryl group; benzyl, phenethyl, or a similar aralkyl group; and 3-chloropropyl, 2-bromoethyl, 3,3,3-trifluoropropyl, or a similar halogenated alkyl group.

In component (I)(B), at least 5, at least 10, at least 15, at least 20, at least 25, at least 30, at least 35, at least 40, at least 45, at least 50, at least 55, at least 60, at least 65, or at least 70, mole percent (%) of all $R^1$ groups are aryl groups.

Component (I)(B) may have a linear, partially branched linear, branched, cyclic, or a three dimensional network molecular structure. Typically, component (I)(B) is a liquid at 25° C. In certain embodiments, component (I)(B) has a viscosity of from 1 to 1,000,000 mPa·s, alternatively from 1 to 10,000 mPa·s, alternatively from 1 to 500 mPa·s, at 25° C.

Silicon-bonded hydrogen atoms of component (I)(B) may assume positions on the molecular terminals, pendent positions, or both. A number of silicon-bonded hydrogen atoms in one molecule is typically from 3 to 500, alternatively from 3 to 10.

Exemplary examples of component (I)(B) include a phenylmethylpolysiloxane capped at both molecular terminals with dimethylhydrogensiloxy groups; a copolymer of methylhydrogensiloxane and phenylmethylsiloxane capped at both molecular terminals with dimethylhydrogensiloxy groups; a copolymer of methylphenylsiloxane and dimethylsiloxane capped at both molecular terminals with dimethylhydrogensiloxy groups; a methylphenylpolysiloxane capped at both molecular terminals with dimethylhydrogensiloxy groups; a methyl hydrogenpolysiloxane capped at both molecular terminals with phenyldimethylsiloxy groups; and a copolymer of methylhydrogensiloxane and methylphenylsiloxane capped at both molecular terminals with trimethylsiloxy groups.

The (I) aryl component comprises components (I)(A) and (I)(B) in an amount to provide a mole ratio of silicon-bonded hydrogen atoms in component (I)(B) to ethylenically unsaturated groups in component (I)(A) of from 0.3 to 5, alternatively from 0.6 to 3.

In certain embodiments, the (I) aryl component comprises a hydrosilylation catalyst. Alternatively or in addition, the composition itself may comprise the hydrosilylation catalyst, which may be present in the composition but not the (I) aryl component itself, or optionally in both. The hydrosilylation catalyst, if present in the (I) aryl component, can be any of the well-known hydrosilylation catalysts comprising a platinum group metal or a compound containing a platinum group metal.

By platinum group metal it is meant ruthenium, rhodium, palladium, osmium, iridium and platinum as well as any complexes thereof. Typically, the platinum group metal is platinum, based on its high activity in hydrosilylation reactions. Platinum group metal-containing catalysts useful for the hydrosilylation catalyst include the platinum complexes prepared as described by Willing, U.S. Pat. No. 3,419,593, and Brown et al, U.S. Pat. No. 5,175,325, each of which is hereby incorporated by reference to show such complexes and their preparation. Other examples of useful platinum group metal-containing catalysts can be found in Lee et al., U.S. Pat. No. 3,989,668; Chang et al., U.S. Pat. No. 5,036,117; Ashby, U.S. Pat. No. 3,159,601; Lamoreaux, U.S. Pat. No. 3,220,972; Chalk et al., U.S. Pat. No. 3,296,291; Modic, U.S. Pat. No. 3,516,946; Karstedt, U.S. Pat. No. 3,814,730; and Chandra et al., U.S. Pat. No. 3,928,629 all of which are hereby incorporated by reference to show useful platinum group metal-containing catalysts and methods for their preparation. The platinum group-containing catalyst can be platinum group metal, platinum group metal deposited on a carrier such as silica gel or powdered charcoal, or a compound or complex of a platinum group metal. Specific examples of platinum-containing catalysts include chloroplatinic add, either in hexahydrate form or anhydrous form, and or a platinum-containing catalyst which is obtained by a method comprising reacting chloroplatinic acid with an aliphatically unsaturated organosilicon compound such as divinyltetramethyldisiloxane, or alkene-platinum-silyl complexes as described in Roy, U.S. Pat. No. 6,605,734. These alkene-platinum-silyl complexes may be prepared, for example by mixing 0.015 mole (COD)PtCl$_2$ with 0.045 mole COD and 0.0612 moles HMeSiCl$_2$.

The hydrosilylation catalyst can also be a supported hydrosilylation catalyst comprising a solid support having a platinum group metal on the surface thereof. Examples of supported catalysts include, but are not limited to, platinum on carbon, palladium on carbon, ruthenium on carbon, rhodium on carbon, platinum on silica, palladium on silica, platinum on alumina, palladium on alumina, and ruthenium on alumina.

The hydrosilylation catalyst may also or alternatively be a photoactivatable hydrosilylation catalyst, which may initiate curing via irradiation and/or heat. The photoactivatable hydrosilylation catalyst can be any hydrosilylation catalyst capable of catalyzing the hydrosilylation reaction, particularly upon exposure to radiation having a wavelength of from 150 to 800 nanometers (nm). The photoactivatable hydrosilylation catalyst can be any of the well-known hydrosilylation catalysts comprising a platinum group metal or a compound containing a platinum group metal. The platinum group metals include platinum, rhodium, ruthenium, palladium, osmium, and iridium. Typically, the platinum group metal is platinum, based on its high activity in hydrosilylation reactions. The suitability of particular photoactivatable hydrosilylation catalysts for use in the composition of the present invention can be readily determined by routine experimentation.

Specific examples of photoactivatable hydrosilylation catalysts suitable for purposes of the present invention include, but are not limited to, platinum(II) β-diketonate complexes such as platinum(II) bis(2,4-pentanedioate), platinum(II) bis(2,4-hexanedioate), platinum(II) bis(2,4-heptanedioate), platinum(II) bis(1-phenyl-1,3-butanedioate, platinum(II) bis(1,3-diphenyl-1,3-propanedioate), platinum (II) bis(1,1,1,5,5,5-hexafluoro-2,4-pentanedioate); (η-cyclopentadienyl)trialkylplatinum complexes, such as (Cp)trimethyl platinum, (Cp)ethyldimethylplatinum, (Cp)triethyl platinum, (chloro-Cp)trimethylplatinum, and (trimethylsilyl-Cp)trimethylplatinum, where Cp represents cyclopentadienyl; triazene oxide-transition metal complexes, such as Pt[C$_6$H$_5$NNNOCH$_3$]$_4$, Pt[p-CN—C$_6$H$_4$NNNOC$_6$H$_{11}$]$_4$, Pt[p-H$_3$COC$_6$H$_4$NNNOC$_6$H$_{11}$]$_4$, Pt[p-CH$_3$(CH$_2$)$_x$—C$_6$H$_4$NNNOCH$_3$]$_4$, 1,5-cyclooctadiene.Pt[p-CN—C$_6$H$_4$NNNOC$_6$H$_{11}$]$_2$, 1,5-cyclooctadiene.Pt[p-CH$_3$O—C$_6$H$_4$NNNOCH$_3$]$_2$, [(C$_6$H$_5$)$_3$P]$_3$Rh[p-CN—C$_6$H$_4$NNNOC$_6$H$_{11}$], and Pd[p-CH$_3$(CH$_2$)$_x$—C$_6$H$_4$NNNOCH$_3$]$_2$, where x is 1, 3, 5, 11, or 17; (η-diolefin) (σ-aryl)platinum complexes, such as (η$^4$-1,5-cyclooctadienyl)diphenylplatinum, (θ$^4$-1,3,5,7-cyclooctatetraenyl)diphenylplatinum, (η$^4$-2,5-norboradienyl)diphenylplatinum, (η$^4$-1,5-cyclooctadienyl)bis-(4-dimethylaminophenyl)platinum, (θ$^4$-1,5-cyclooctadienyl)bis-(4-acetylphenyl)platinum, and (η$^4$-1,5-cyclooctadienyl)bis-(4-trifluormethylphenyl)platinum.

Typically, the photoactivatable hydrosilylation catalyst is a

Pt(II) β-diketonate complex and more typically the catalyst is platinum(II) bis(2,4-pentanedioate). The hydrosilylation catalyst can be a single photoactivatable hydrosilylation catalyst or a mixture comprising two or more different photoactivatable hydrosilylation catalysts.

If present in the (I) aryl component itself, the concentration of the hydrosilylation catalyst is typically sufficient to catalyze the hydrosilylation reaction between components (I)(A) and (I)(B). The concentration of the hydrosilylation catalyst typically provides from 0.1 to 1000 ppm of platinum group metal, alternatively from 0.5 to 100 ppm of platinum group metal, alternatively from 1 to 25 ppm of platinum group metal, based on the combined weight of components (I)(A) and (I)(B).

The (I) aryl component may optionally comprise additional components, exemplified by fillers, which may optionally be surface treated, such as fumed silica, baked silica, wet-process silica, quartz powder, titanium oxide, fumed titanium oxide, calcium carbonate, iron oxide, zinc oxide, aluminum hydroxide, etc.; heat-conductive fillers, such as aluminum oxide, silicon nitride, boron nitride, diamond powder, etc.; electrically conductive fillers, such as copper powder, gold powder, silver powder, nickel powder, gold-coated copper powder, conductive carbon black, etc.; pigments, such as carbon black, bengala, titanium oxide, etc. The amount of each such optional component in the (I) aryl component is typically from 0 to 10 weight percent (%) based on the total weight of the (I) aryl component.

The (I) aryl component, or any component thereof, may be disposed in a vehicle, alternatively a solvent, particularly to reduce a viscosity and improve mixing with other components of the composition. The vehicle may be any vehicle for carrying the components of the (I) aryl component, alternatively at least partially solubilizing the components of the (I) aryl component, alternatively solubilizing the components of the (I) aryl component.

Examples of suitable vehicles include, but are not limited to, saturated aliphatic hydrocarbons such as n-pentane, hexane, n-heptane, isooctane and dodecane; cycloaliphatic hydrocarbons such as cyclopentane and cyclohexane; aromatic hydrocarbons such as benzene, ethylbenzene, toluene, xylene and mesitylene; cyclic ethers such as tetrahydrofuran (THF) and dioxane; alcohols such as methanol, ethanol, isopropanol, butanol, or n-propanol; ketones such as methyl isobutyl ketone (MIBK); glycol ethers such as propylene glycol methyl ether, dipropylene glycol methyl ether, propylene glycol n-butyl ether, propylene glycol n-propyl ether, propylene glycol methyl ether acetate (PGMEA), or ethylene glycol n-butyl ether; halogenated alkanes such as trichloroethane, dichloromethane, 1,1,1-trichloroethane, methylene chloride or chloroform; dimethyl sulfoxide; dimethyl formamide; acetonitrile; white spirits; mineral spirits; naphtha; silicone fluids and oils, including cyclic and/or linear siloxanes; and halogenated aromatic hydrocarbons such as bromobenzene and chlorobenzene. Combinations of different vehicles may also be utilized. In specific embodiments, the (I) aryl component comprises a siloxane vehicle, which is typically a cyclic siloxane, e.g. a phenylmethyl cyclic having, for example, from 3 to 10 siloxy units. Alternatively or in addition, the siloxane vehicle may be linear, partially branched, branched, or may have other structures.

The (I) aryl component may further comprise one or more optional components, including adhesion promoters, inhibitors, dyes, pigments, anti-oxidants, heat stabilizers, flame retardants, flow control additives, fillers (including extending and/or reinforcing fillers), etc.

The (I) aryl component may be a one component system, a two component (2k) system, or otherwise may separate various components to prevent premature curing thereof. For example, the (I)(A) organopolysiloxane and the (I)(B) organohydrogenpolysiloxane may be separated from one another, or present together but separate from the hydrosilylation catalyst, or the optional inhibitor may be utilized to further prevent premature reaction or curing.

The composition further comprises (II) a methyl component. The (II) methyl component comprises (A) an organopolysiloxane having the following average formula:

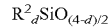

$$R^2_d SiO_{(4-d)/2}$$

wherein each $R^2$ is an independently selected substituted or unsubstituted hydrocarbyl group with the proviso that in one molecule, at least two of $R^2$ include ethylenic unsaturation and at least 20 mole percent (%) of all $R^2$ groups are methyl groups, and wherein d is selected such that $0.5 \leq d \leq 2.2$.

Specific examples of $R^2$ as the independently selected substituted or unsubstituted hydrocarbyl group, as well as those $R^2$ which include ethylenic unsaturation, are set forth above for R.

In component (II)(A), at least 20, at least 25, at least 35, at least 40, at least 45, at least 50, at least 55, at least 60, at least 65, at least 70, at least 75, at least 80, at least 85, at least 90, at least 95, at least 96, at least 97, at least 98, at least 99, or 100, mole percent (%) of all $R^2$ groups are methyl groups, with the exception of the $R^2$ groups which include ethylenic unsaturation. In specific embodiments, all $R^2$ groups in component (II)(A) are methyl groups or hydrocarbyl groups having ethylenic unsaturation.

Component (II)(A) is typically substantially linear, alternatively linear such that $1.9 \leq d \leq 2.2$. At a temperature of 25° C., component (II)(A) is typically a flowable liquid or is in the form of an uncured rubber. Generally, component (II)(A) has a viscosity of from 1 to 10,000,000 mPa·s, alternatively from 1 to 1,000,000 mPa·s, alternatively from 1 to 100,000 mPa·s, alternatively from 100 to 10,000 mPa·s, at 25° C. Viscosity may be measured at 25° C. via a Brookfield LV DV-E viscosimeter, as understood in the art.

In these embodiments, component (II)(A) can be exemplified by a dimethylpolysiloxane capped at both molecular terminals with dimethylvinylsiloxy groups, a copolymer of a methylhydrocarbylsiloxane and dimethylsiloxane capped at both molecular terminals with dimethylvinylsiloxy groups, a copolymer of a methylvinylsiloxane and a methylalkylsiloxane capped at both molecular terminals with dimethylvinylsiloxy groups, a vinylmethylsiloxane capped at both molecular terminals with trimethylsiloxy groups, and combinations thereof.

In certain embodiments, component (II)(A) further comprises a resinous organopolysiloxane having average formula:

$$R^2_{d'} SiO_{(4-d')/2}$$

wherein each $R^2$ is independently selected and defined above, and wherein d' is selected such that $0.5 \leq d' \leq 3.2$, alternatively such that $0.5 \leq d' \leq 1.7$.

The resinous organopolysiloxane has a branched or a three dimensional network molecular structure. At 25° C., the (A)(ii) resinous organopolysiloxane may be in a liquid or in a solid form. The (A)(ii) resinous organopolysiloxane may comprise the following siloxy units: $R^2_3 SiO_{1/2}$ units (i.e., M units); $R^2_2 SiO_{2/2}$ units (i.e., D units), $R^2 SiO_{3/2}$ units (i.e., T units) and/or $SiO_{4/2}$ units (i.e., Q units).

In specific embodiments, the resinous organopolysiloxane may be exemplified by an organopolysiloxane that comprises only T units, an organopolysiloxane that comprises T units in combination with other siloxy units, or an organopolysiloxane comprising Q units in combination with other siloxy units, e.g. an MQ resin. Typically, the resinous organopolysiloxane comprises T and/or Q units. A specific example of the resinous organopolysiloxane is a vinyl-terminated methyl silsesquioxane. Another specific example of the resinous organopolysiloxane is a vinyl-terminated MQ resin.

When component (II)(A) comprises a mixture of the substantially linear organopolysiloxane and the resinous organopolysiloxane, the substantially linear organopolysiloxane is typically present in the mixture in an amount of from 30 to 99, alternatively from 40 to 90, mass percent (%) based on the total weight of the mixture. In these embodiments, the mixture comprises the resinous organopolysiloxane in an amount of from 1 to 70, alternatively from 10 to 60, mass percent (%).

The (II) methyl component further comprises (B) an organohydrogenpolysiloxane having the following average formula:

$$R^3{}_e H_f SiO_{(4-e-f)/2}$$

wherein each $R^3$ is an independently selected substituted or unsubstituted hydrocarbyl group free from ethylenic unsaturation with the proviso that in one molecule, at least 20 mole percent (%) of all $R^3$ groups are methyl groups, and e and f are selected such that $1.0 \leq e < 2.2$; $0.002 < f \leq 1$; and $1.0 < e+f < 3.0$. In certain embodiments, $0.02 < f < 1$.

$R^3$ may be any of the substituted or unsubstituted hydrocarbyl groups set forth above for R, with the exception of those examples of R which include ethylenic unsaturation (i.e., alkenyl and alkynyl groups). Specific examples of $R^3$ include methyl, ethyl, propyl, isopropyl, butyl, isobutyl, t-butyl, pentyl, hexyl, cyclohexyl, heptyl, octyl, nonyl, decyl, or a similar alkyl group; a phenyl, tolyl, xylyl, naphthyl, or a similar aryl group; benzyl, phenethyl, or a similar aralkyl group; and 3-chloropropyl, 2-bromoethyl, 3,3,3-trifluoropropyl, or a similar halogenated alkyl group.

In component (II)(B), at least 20, at least 25, at least 30, at least 35, at least 40, at least 45, at least 50, at least 55, at least 60, at least 65, at least 70, at least 75, at least 80, at least 85, at least 90, at least 95, at least 96, at least 97, at least 98, at least 99, or 100, mole percent (%) of all $R^3$ groups are methyl groups.

Component (II)(B) may have a linear, partially branched linear, branched, cyclic, or a three dimensional network molecular structure. Typically, component (II)(B) is a liquid at 25° C. In certain embodiments, component (II)(B) has a viscosity of from 1 to 10,000,000 mPa·s, alternatively from 1 to 1,000,000 mPa·s, alternatively from 1 to 100,000 mPa·s, alternatively from 100 to 10,000 mPa·s, at 25° C. Viscosity may be measured at 25° C. via a Brookfield LV DV-E viscosimeter, as understood in the art.

Silicon-bonded hydrogen atoms of component (II)(B) may assume positions on the molecular terminals, pendent positions, or both. A number of silicon-bonded hydrogen atoms in one molecule is typically from 3 to 500, alternatively from 3 to 10.

Exemplary examples of component (II)(B) include a dimethylpolysiloxane capped at both molecular terminals with dimethylhydrogensiloxy groups; a copolymer of methylhydrogensiloxane and dimethylsiloxane capped at both molecular terminals with dimethylhydrogensiloxy groups; a copolymer of methylphenylsiloxane and dimethylsiloxane capped at both molecular terminals with dimethylhydrogensiloxy groups; a methylphenylpolysiloxane capped at both molecular terminals with dimethylhydrogensiloxy groups; a methylhydrogenpolysiloxane capped at both molecular terminals with trimethylsiloxy groups, a copolymer of methylhydrogensiloxane and dimethylsiloxane capped at both molecular terminals with trimethylsiloxy groups; and a copolymer of methylhydrogensiloxane and methylphenylsiloxane capped at both molecular terminals with trimethylsiloxy groups.

The (II) methyl component comprises components (II)(A) and (II)(B) in an amount to provide a mole ratio of silicon-bonded hydrogen atoms in component (II)(B) to ethylenically unsaturated groups in component (II)(A) of from 0.3 to 5, alternatively from 0.6 to 3.

In certain embodiments, the (II) methyl component further comprises a filler, which may optionally be surface treated. The filler may be fumed silica, baked silica, wet-process silica, quartz powder, titanium oxide, fumed titanium oxide, calcium carbonate, iron oxide, zinc oxide, aluminum hydroxide, etc.; heat-conductive fillers, such as aluminum oxide, silicon nitride, boron nitride, diamond powder, etc.; electrically conductive fillers, such as copper powder, gold powder, silver powder, nickel powder, gold-coated copper powder, conductive carbon black, etc.

The (II) methyl component, or any component thereof, may be disposed in a vehicle, alternatively a solvent, particularly to reduce a viscosity and improve mixing with other components of the composition. The vehicle may be any vehicle for carrying the components of the (II) methyl component, alternatively at least partially solubilizing the components of the (II) methyl component, alternatively solubilizing the components of the (II) methyl component.

Examples of suitable vehicles include, but are not limited to, saturated aliphatic hydrocarbons such as n-pentane, hexane, n-heptane, isooctane and dodecane; cycloaliphatic hydrocarbons such as cyclopentane and cyclohexane; aromatic hydrocarbons such as benzene, ethylbenzene, toluene, xylene and mesitylene; cyclic ethers such as tetrahydrofuran (THF) and dioxane; alcohols such as methanol, ethanol, isopropanol, butanol, or n-propanol; ketones such as methyl isobutyl ketone (MIBK); glycol ethers such as propylene glycol methyl ether, dipropylene glycol methyl ether, propylene glycol n-butyl ether, propylene glycol n-propyl ether, propylene glycol methyl ether acetate (PGMEA), or ethylene glycol n-butyl ether; halogenated alkanes such as trichloroethane, dichloromethane, 1,1,1,-trichloroethane, methylene chloride or chloroform; dimethyl sulfoxide; dimethyl formamide; acetonitrile; white spirits; mineral spirits; naphtha; silicone fluids and oils, including cyclic and/or linear siloxanes; and halogenated aromatic hydrocarbons such as bromobenzene and chlorobenzene. Combinations of different vehicles may also be utilized. The amount of the vehicle in the (II) methyl component may vary depending on a desired viscosity thereof.

In certain embodiments, (II) methyl component comprises a hydrosilylation catalyst. Alternatively or in addition, the composition itself may comprise the hydrosilylation catalyst, which may be present in the composition but not the (II) methyl component itself, or optionally in both. The hydrosilylation catalyst, if present in the (II) methyl component, can be any of the well-known hydrosilylation catalysts comprising a platinum group metal or a compound containing a platinum group metal. Specific examples thereof are provided above with respect to the (I) aryl component.

If present in the (II) methyl component itself, the concentration of the hydrosilylation catalyst is typically sufficient to catalyze the hydrosilylation reaction between components (II)(A) and (II)(B). The concentration of the hydrosilylation catalyst typically provides from 0.1 to 1000 ppm of platinum group metal, alternatively from 0.5 to 100 ppm of platinum group metal, alternatively from 1 to 25 ppm of platinum group metal, based on the combined weight of components (II)(A) and (II)(B).

The (II) methyl component may further comprise one or more optional components, including adhesion promoters, inhibitors, dyes, pigments, anti-oxidants, heat stabilizers, flame retardants, flow control additives, fillers (including extending and reinforcing fillers), etc.

The (II) methyl component may be a one component system, a two component (2k) system, or otherwise may separate various components to prevent premature curing thereof. For example, the (INA) organopolysiloxane and the (II)(B) organohydrogenpolysiloxane may be separated from one another, or present together but separate from the hydrosilylation catalyst, or the optional inhibitor may be utilized to further prevent premature reaction or curing.

The (I) aryl component is present in the composition in an amount of from 0.15 to 21.0, alternatively from 2 to 20, alternatively from 3 to 19, alternatively from 4 to 18, alternatively from 5 to 17, alternatively from 6 to 16, alternatively from 7 to 15, alternatively from 8 to 14, alternatively from 9 to 13, alternatively from 10 to 12, alternatively from 10.5 to 11.5, weight percent based on the total weight of the (I) aryl component and the (II) methyl component. The (II) methyl component is present in the composition in an amount of from 79.0 to 99.85, alternatively from 80 to 98, alternatively from 81 to 97, alternatively from 82 to 96, alternatively from 83 to 95, alternatively from 84 to 94, alternatively from 85 to 93, alternatively from 86 to 92, alternatively from 87 to 91, alternatively from 88 to 90, alternatively from 88.5 to 89.5, weight percent based on the total weight of the (I) aryl component and the (II) methyl component.

The composition further comprises (III) a hydrosilylation catalyst. The hydrosilylation catalyst may be present in the (I) aryl component, the (II) methyl component, and/or the composition generally. For example, the (III) hydrosilylation catalyst may be present in the (I) aryl component and/or the (II) methyl component such that the composition comprises the (III) hydrosilylation catalyst upon formation of the composition. Alternatively, the (III) hydrosilylation catalyst may be separate from the (I) aryl component and the (II) methyl component and only combined with the (I) aryl component and the (II) methyl component when forming the composition to prevent premature reaction within the (I) aryl component and the (II) methyl component.

Specific examples of suitable hydrosilylation catalysts are set forth above. The concentration of the (III) hydrosilylation catalyst in the composition is typically sufficient to catalyze the hydrosilylation reaction between components (I)(A) and (I)(B) and between (II)(A) and (II)(B), although component (I)(A) may react with component (II)(B) and component (I)(B) may react with component (INA) as well. The concentration of the hydrosilylation catalyst typically provides from 0.1 to 1000 ppm of platinum group metal, alternatively from 0.5 to 100 ppm of platinum group metal, alternatively from 1 to 25 ppm of platinum group metal, based on the combined weight of components (I)(A), (I)(B), (INA), and (II)(B).

The composition may be a one component, two component, or even three component system. For example, the (I) aryl component and the (II) methyl component may be separated from one another, optionally separate from the (III) hydrosilylation catalyst.

A method of preparing the composition is also provided ("the preparation method"). The preparation method comprises combining components (I)(A), (I)(B), (II)(A), (II)(B) and (III) to give the composition. The components may be combined in any order and manner. For example, the (I) aryl component and the (II) methyl component may be separately formed and combined to give the composition, or the (I) aryl component and the (II) methyl component may be formed in situ when combining components (I)(A), (I)(B), (II)(A), and (II)(B).

In specific embodiments of the preparation method, components (I)(A) and (I)(B) are combined to give the (I) aryl component, components (II)(A) and (II)(B) are combined to give the (II) methyl component, and the (I) aryl component and the (II) methyl component are combined to give the composition. In this embodiment, the (III) hydrosilylation catalyst is (i) present in the (I) aryl component; (ii) present in the (II) methyl component; (iii) combined with the (I) aryl component and (II) methyl component, or (iv) any combination of (i)-(iv).

Further to combining, in certain embodiments, components (I)(A) and (I)(B) are mixed to give the (I) aryl component, and components (II)(A) and (II)(B) are mixed to give the (II) methyl component. Mixing may be done manually (e.g. by hand) or by any suitable method, e.g. blade, blender, etc. In certain embodiments, the (I) aryl component and the (II) methyl component are mixed under shear when forming the composition. For example, the (I) aryl component and the (II) methyl component may be mixed one or more times at a rate of from greater than 0 to 4,000, alternatively from 1,000 to 3,000, alternatively from 1,500 to 2,500, revolutions per minute (rpms). The (I) aryl component and the (II) methyl component may be mixed for a period of time from greater than 0 to 60 seconds, e.g. from 20 to 40 seconds, optionally in multiple successions.

Typically, the (I) aryl component is disposed in the (II) methyl component when forming the composition. However, the (II) methyl component may be disposed in the (I) aryl component when forming the composition. Alternatively still, both the (I) aryl component and the (II) methyl component may be simultaneously disposed in a vessel and mixed.

The present invention further provides a method of forming an article ("formation method"). The formation method comprises disposing the composition on a substrate to give a deposit. The formation method further comprises curing the deposit on the substrate to give the article. The article may alternatively be referred to as a cured product of the composition.

The composition is typically disposed on the substrate upon its formation to prevent phase separation or premature curing thereof. Disposing or dispensing the composition may comprise any suitable application technique. Typically, the composition is applied in wet form via a wet coating technique. In certain embodiments, the composition is applied by i) spin coating; ii) brush coating; iii) drop coating; iv) spray coating; v) dip coating; vi) roll coating; vii) flow coating; viii) slot coating; ix) gravure coating; or x) a combination of any of i) to ix).

The substrate is not limited and may be any substrate. For example, the substrate may be a mold, which may optionally be heated in connection with curing the deposit. The article may be separable from the substrate or may be physically and/or chemically bonded to the substrate depending on its selection. The substrate may have an integrated hot plate or an integrated or stand-alone furnace for curing the deposit.

When the substrate is the mold, the deposit may take the shape defined by the mold. Alternatively, the deposit may be applied uniformly or non-uniformly depending on desired shape and dimension of the article formed from the deposit.

The deposit is typically cured at an elevated temperature for a period of time. The elevated temperature is typically from to 50 to 250, alternatively from 100 to 200, alternatively from 110 to 190, alternatively from 120 to 180, alternatively from 130 to 170, alternatively from 140 to 160, alternatively from 145 to 155,° C. The period of time is typically sufficient to effect curing, i.e., cross-linking, of the composition. In certain embodiments, the period of time is from greater than 0 to 10, alternatively from 1 to 7, alternatively from 3 to 5, hours. The period of time may be broken down into cure iterations, e.g. a first-cure and a post-cure, with the first-cure being, for example, one hour and the post cure being, for example, three hours. The elevated temperature may be independently selected in such iterations, and may be the same in each iteration.

Depending on a thickness and other dimensions of the deposit and article, the article could also be formed via an iterative process. For example, a first deposit may be formed and subjected to a first elevated temperature for a first period of time to give a partially cured deposit. Then, a second deposit may be disposed on the partially cured deposit and subjected to a second elevated temperature for a second period of time to give a second partially cured deposit. The partially cured deposit will also further cure during exposure to the second elevated temperature for the second period of time. A third deposit may be disposed on the second partially cured deposit and subjected to a third elevated temperature for a third period of time to give a third partially cured deposit. The second partially cured deposit will also further cure during exposure to the second elevated temperature for the second period of time. This process may be repeated, for example, from 1 to 50 times to build the article as desired. A composite is of partially cured layers is typically subjected to a final post-cure, e.g. at the elevated temperature and period of time above. Each elevated temperature and period of time may be independently selected and may be the same as or different from one another. When the article is formed via the iterative process, each deposit may also be independently selected and may differ in terms of components selected in the composition and/or their amounts.

In certain embodiments, the deposit comprises a wet film. In these embodiments, the iterative process may be wet-on-wet, depending on a cure state of the partially cured layer. Alternatively, the iterative process may be wet-on-dry.

Curing drives any vehicle, if present, from the composition. Curing also begins to initiate structural changes within the deposit as the article is formed.

In certain embodiments, the article is a film. The film has a thickness that may vary depending upon its end use application. Typically, the film has a thickness of from greater than 0 to 4,000 micrometers (μm), alternatively from greater than 0 to 3,000 micrometers (μm), alternatively from greater than 0 to 2,000 micrometers (μm), alternatively from 100 to 1,000 micrometers (μm), alternatively from 350 to 830 micrometers (μm). However, other thicknesses are contemplated, e.g. from 0.1 to 200 μm. For example, the thickness of the film may be from 0.2 to 175 μm; alternatively from 0.5 to 150 μm; alternatively from 0.75 to 100 μm; alternatively from 1 to 75 μm; alternatively from 2 to 60 μm; alternatively from 3 to 50 μm; alternatively from 4 to 40 μm; alternatively any one of 1, 2, 3, 4, 5, 6, 7, 8, 9, 10, 15, 20, 25, 30, 35, 40, 45, 50, 60, 70, 75, 80, 90, 100, 150, 175, and 200 μm.

If desired, the film may be subjected to further processing depending upon its end use application. For example, the film may be subjected to oxide deposition (e.g. $SiO_2$ deposition), resist deposition and patterning, etching, chemical or plasma stripping, metallization, or metal deposition. Such further processing techniques are generally known.

Such deposition may be chemical vapor deposition (including low-pressure chemical vapor deposition, plasma-enhanced chemical vapor deposition, and plasma-assisted chemical vapor deposition), physical vapor deposition, or other vacuum deposition techniques. Many such further processing techniques involve elevated temperatures, particularly vacuum deposition, for which the film is well suited in view of its excellent thermal stability. Depending on an end use of the film, however, the film may be utilized with such further processing.

In certain embodiments, the article or the cured product formed from the composition may be utilized in various optical or light applications and devices, e.g. a liquid crystal device, such as a light modulator, a light diffuser (e.g., to re-direct light, such as to provide opacity which can provide a privacy function), a touch screen (e.g., a transparent electrical device or switch), a window, a smart window, etc. The article or cured product is particularly suited for use as the light diffuser. The cured product exhibits diffusion of transmitted light when exposed to light. In certain embodiments, the cured product exhibits Lambertian reflectance, or has a Lambertian-type diffusion profile.

The article or cured product may be utilized in an LED or OLED or another light-emitting or light-absorbing semiconductor component. The cured product can form any part of the optical device through which light is reflected and/or refracted, either with or without modification or manipulation of the light. The cured product can be part of an optical integrated circuit, such as integrated circuits, such as part of an attenuator, switch, splitter, router, filter, or grating.

A lighting device comprising the light diffuser formed from the composition is also provided by the present invention. The lighting device may be any lighting device, e.g. a luminaire. The lighting device may rely on light from a light-emitting diode, an incandescent light, a compact fluorescent light, a halogen light, a metal halide light, a sodium vapor light, etc. The lighting device may be utilized in residential, commercial, or other applications, including in electronics applications.

A method of diffusely transmitting light is further provided by the invention. This method comprises exposing the light diffuser formed from the composition to light, thereby diffusing transmitted light.

In specific embodiments, the light diffuser has a transmission at a wavelength of from 350 to 800 nanometers (nm) without cut-off.

Embodiment 1 relates to a composition, comprising:
(I) an aryl component, comprising:
A. an organopolysiloxane having the following average formula:

$$R_aSiO_{(4-a)/2}$$

wherein each R is an independently selected substituted or unsubstituted hydrocarbyl group with the proviso that in one molecule, at least two of R include ethylenic unsaturation and at least 20 mole percent (%) of all R groups are aryl groups, and wherein a is selected such that 0.5≤a≤2.2; and
B. an organohydrogenpolysiloxane having the following average formula:

$$R^1_bH_cSiO_{(4-b-c)/2}$$

wherein each $R^1$ is an independently selected substituted or unsubstituted hydrocarbyl group free from ethylenic unsaturation with the proviso that in one molecule, at least 5 mole percent (%) of all $R^1$ groups are aryl groups, and b and c are selected such that 1.0<b<2.2; 0.002<c<1; and 1.0<b+c<3.0; wherein components (I)(A) and (I)(B) are present in the aryl component in an amount to provide a mole ratio of silicon-bonded hydrogen atoms in component (I)(B) to ethylenically unsaturated groups in component (I)(A) of from 0.3 to 5; and (II) a methyl component, comprising:
A. an organopolysiloxane having the following average formula:

$$R^2_d SiO_{(4-d)/2}$$

wherein each $R^2$ is an independently selected substituted or unsubstituted hydrocarbyl group with the proviso that in one molecule, at least two of $R^2$ include ethylenic unsaturation and at least 20 mole percent (%) of all $R^2$ groups are methyl groups, and wherein d is selected such that 0.5≤d≤2.2; and B. an organohydrogenpolysiloxane having the following average formula:

$$R^3_e H_f SiO_{(4-e-f)/2}$$

wherein each $R^3$ is an independently selected substituted or unsubstituted hydrocarbyl group free from ethylenic unsaturation with the proviso that in one molecule, at least 20 mole percent (%) of all $R^3$ groups are methyl groups, and e and f are selected such that 1.0<e<2.2; 0.002<f<1; and 1.0<e+f<3.0;
wherein components (II)(A) and (II)(B) are present in the methyl component in an amount to provide a mole ratio of silicon-bonded hydrogen atoms in (II)(B) to ethylenically unsaturated groups in (II)(A) of from 0.3 to 5; and (III) a hydrosilylation catalyst;
wherein component (I) is present in the composition in an amount of from 0.15 to 21.0 weight percent based on the total weight of components (I) and (II).

Embodiment 2 relates to the composition of Embodiment 1, wherein: (i) when cured to give a cured product, the cured product exhibits diffusion of transmitted light when exposed to light; or (ii) component (I)(A) comprises a mixture, comprising:

(A)(i) a substantially linear organopolysiloxane having average formula:

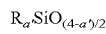

$$R_a SiO_{(4-a')/2}$$

wherein each R and its provisos are defined above, and wherein a' is selected such that 1.9≤a'≤2.2; and (A)(ii) a resinous organopolysiloxane having average formula

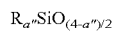

$$R_{a''} SiO_{(4-a'')/2}$$

wherein each R and its provisos are defined above, and wherein a'' is selected such that 0.5≤a''≤1.7; or (iii) both (i) and (ii).

Embodiment 3 relates to a method of preparing the composition of Embodiment 1 or 2, the method comprising: combining components (I)(A), (I)(B), (II)(A), (II)(B) and (III) to give the composition.

Embodiment 4 relates to the method of Embodiment 3, wherein components (I)(A) and (I)(B) are combined to give the (I) aryl component, components (II)(A) and (II)(B) are combined to give the (II) methyl component, the (I) aryl component and the (II) methyl component are combined to give the composition, and wherein the (III) hydrosilylation catalyst is (i) present in the (I) aryl component; (ii) present in the (II) methyl component; (iii) combined with the (I) aryl component and (II) methyl component, or (iv) any combination of (i)-(iii); or wherein components (I)(A) and (I)(B) are mixed to give the (I) aryl component, components (II)(A) and (II)(B) are mixed to give the (II) methyl component, and wherein the (I) aryl component is disposed in the (II) methyl component.

Embodiment 5 relates to a method of forming an article, the method comprising:
disposing a composition on a substrate to give a deposit, and
curing the deposit on the substrate to give the article;
wherein the composition is the composition of Embodiment 1 or 2.

Embodiment 6 relates to the method of Embodiment 5, wherein: (i) curing the deposit comprises exposing the deposit to an elevated temperature for a period of time; (ii) the deposit comprises a wet film; (iii) the method further comprises preparing the composition prior to disposing the composition on the substrate; or (iv) any combination of (i)-(iii).

Embodiment 7 relates to an article formed in accordance with the method of Embodiment 5 or 6.

Embodiment 8 relates to the article of Embodiment 7 having a thickness of from greater than 0 to 2,000 micrometers (μm); or further defined as a light diffuser; or having a thickness of from greater than 0 to 2,000 micrometers (μm) and further defined as a light diffuser.

Embodiment 9 relates to a lighting device comprising as a light diffuser the article of Embodiment 7 or 8.

Embodiment 10 relates to a method of diffusely transmitting light, the method comprising:
exposing a light diffuser to light, thereby diffusing transmitted light;
wherein the light diffuser is the article of Embodiment 7 or 8;
optionally, wherein the light diffuser has a transmission at a wavelength of from 350 to 800 nanometers (nm) without cut-off.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, different, special, and/or unexpected results may be obtained from each member of the respective Markush group independent from all other Markush members. Each member of a Markush group may be relied upon individually and or in combination and provides adequate support for specific embodiments within the scope of the appended claims.

Further, any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The following examples are intended to illustrate the invention and are not to be viewed in any way as limiting to the scope of the invention.

EXAMPLES

Example 1

An (I) aryl component is prepared. The components and relative amounts utilized to prepare the (I) aryl component are set forth below in Table 1.

TABLE 1

| Component: | Amount (wt. %) |
|---|---|
| Organopolysiloxane 1 | 43.67 |
| Organopolysiloxane 2 | 38.33 |
| Organohydrogenpolysiloxane 1 | 15.46 |
| Organohydrogenpolysiloxane 2 | 0.5 |
| Catalyst | 0.0068 |
| Inhibitor | 0.01 |
| Adhesion Promoter | 2.03 |

Organopolysiloxane 1 is a linear methylphenylpolysiloxane having both molecular terminals capped with dimethylvinylsiloxy groups with 0.20 wt. % content of silicon-bonded vinyl groups and 49 mole % of silicon-bonded phenyl groups among all silicon-bonded organic groups. Organopolysiloxane 1 has a viscosity at 25° C. of 3,500 mPa·s.

Organopolysiloxane 2 has the following average unit formula:

$$(C_6H_5SiO_{3/2})_{0.75}[(CH_2=CH)(CH_3)_2SiO_{1/2}]_{0.25},$$

and contains 20 mole % of silicon-bonded vinyl groups and 50 mole % of silicon-bonded phenyl groups of all silicon-bonded organic groups, and has a weight-average molecular weight referenced to polystyrene of 1,600.

Organohydrogenpolysiloxane 1 has the following average unit formula:

$$H(CH_3)_2SiO(C_6H_5)_2SiOSi(CH_3)_2H,$$

where 33 mole % of all silicon-bonded organic groups are phenyl groups. Organohydrogenpolysiloxane 1 has a viscosity at 25° C. of 4.0 mPa·s Organohydrogenpolysiloxane 2 has the following average unit formula:

$$(C_6H_5SiO_{3/2})_{0.40}[H(CH_3)_2SiO_{1/2}]_{0.60}$$

where 43 mole % of all silicon-bonded organic groups are phenyl groups. Organohydrogenpolysiloxane 2 has a viscosity at 25° C. of 750 mPa·s and a mass-average molecular weight of 1,000.

Catalyst comprises a complex of platinum with 1,3-divinyl-1,1,3,3-tetramethyldisiloxane in such an amount that in weight units metallic platinum comprised 2.5 ppm.

Inhibitor comprises 2-phenyl-3-butyn-2-ol.

Adhesion promoter comprises a glycidoxypropyl-functional siloxane.

The components are disposed in a vacuum dental mixer and mixed for 30 seconds at 1,500 revolutions per minute (rpm) and then for 30 seconds at 2,000 rpm to give the (I) aryl component, which is homogenous upon formation. The ratio of silicon-bonded hydrogen atoms to silicon-bonded alkenyl groups is 1.3.

A (II) methyl component is prepared. The components and relative amounts utilized to prepare the (II) methyl component are set forth below in Table 2.

TABLE 2

| Component: | Amount (wt. %) |
|---|---|
| Organopolysiloxane 3 | 37.9725 |
| Organopolysiloxane 4 | 37.0275 |
| Organopolysiloxane 5 | 11.9 |
| Organopolysiloxane 6 | 8.5 |
| Organohydrogenpolysiloxane 3 | 3.9 |
| Catalyst | 0.12 |
| Inhibitor | 0.06 |
| Adhesion promoter | 0.5 |

Organopolysiloxane 3 has the average unit formula:

$$(ViMe_2SiO_{1/2})_{0.11}(Me_3SiO_{1/2})^{0.33}(SiO_{4/2})_{0.56}(HO_{1/2})_{0.01},$$

where Vi designates vinyl and Me designates methyl.

Organopolysiloxane 4 has the average unit formula:

$$ViMe_2SiO(Me_2SiO)_{515}SiMe_2Vi,$$

where Vi designates vinyl and Me designates methyl.

Organopolysiloxane 5 has the average unit formula:

$$ViMe_2SiO(Me_2SiO)_{160}SiMe_2Vi,$$

where Vi designates vinyl and Me designates methyl.

Organopolysiloxane 6 has the average unit formula:

$$ViMe_2SiO(Me_2SiO)_{420}SiMe_2Vi,$$

where Vi designates vinyl and Me designates methyl.

Organohydrogenpolysiloxane 3 has the average unit formula:

$$Me_3SiO(MeHSiO)_{50}SiMe_3,$$

where Me designates methyl.

The components are disposed in a vacuum dental mixer and mixed for 30 seconds at 1,500 revolutions per minute (rpm) and then for 30 seconds at 2,000 rpm to give the (II) methyl component, which is homogenous upon formation. The ratio of silicon-bonded hydrogen atoms to silicon-bonded alkenyl groups is 1.5.

Immediately upon formation, the (I) aryl component is combined with the (II) methyl component in an amount of 8 wt. % based on the total weight of the (I) aryl component and the (II) methyl component to give a mixture. The mixture is mixed in a vacuum dental mixer for 30 seconds at 1,500 rpm and then for 30 seconds at 2,000 rpm to give a solution.

The solution is disposed on a polytetrafluoroethylene sheet and cured in a hot press at 150° C. for one hour to give an article in the form of a film having a thickness of 350 micrometers (μm). The thickness of the film is maintained during curing via spacers.

Normalized intensity of the film is measured with incident light at 0° C. as a function of diffusion angle. Normalized intensity is measured via a Konica-Minolta CM-3600A spectrophotometer, commercially available from Konica Minolta. Directional and non-directional transmittance is measured at different angles from −90° to +90°. These results are set forth below in Table 3.

TABLE 3

| Diffusion angle (degree) | Normalized intensity (a.u.) |
| --- | --- |
| −90 | 0.00 |
| −80 | 0.12 |
| −70 | 0.29 |
| −60 | 0.47 |
| −50 | 0.62 |
| −40 | 0.75 |
| −30 | 0.85 |
| −20 | 0.93 |
| −10 | 0.98 |
| 0 | 1 |
| 10 | 0.98 |
| 20 | 0.94 |
| 30 | 0.86 |
| 40 | 0.76 |
| 50 | 0.63 |
| 60 | 0.48 |
| 70 | 0.31 |
| 80 | 0.14 |
| 90 | 0.01 |

The invention has been described in an illustrative manner, and it is to be understood that the terminology which has been used is intended to be in the nature of words of description rather than of limitation. Obviously, many modifications and variations of the present invention are possible in light of the above teachings. The invention may be practiced otherwise than as specifically described.

What is claimed is:

1. A composition, comprising:
   (I) an aryl component, comprising:
      (A) an organopolysiloxane having the following average formula:

$R_a SiO_{(4-a)/2}$ wherein each R is an independently selected substituted or unsubstituted hydrocarbyl group with the proviso that in one molecule, at least two of R include ethylenic unsaturation and at least 20 mole percent (%) of all R groups are aryl groups, and wherein a is selected such that $0.5 \leq a \leq 2.2$; and
      (B) an organohydrogenpolysiloxane having the following average formula:

$R^1_b H_c SiO_{(4-b-c)/2}$ wherein each $R^1$ is an independently selected substituted or unsubstituted hydrocarbyl group free from ethylenic unsaturation with the proviso that in one molecule, at least 5 mole percent (%) of all $R^1$ groups are aryl groups, and b and c are selected such that $1.0<b<2.2$; $0.002<c<3.0$;

wherein components (I)(A) and (I)(B) are present in said aryl component (I) in an amount to provide a mole ratio of silicon-bonded hydrogen atoms in component (I)(B) to ethylenically unsaturated groups in component (I)(A) of from 0.3 to 5; and
   (II) a methyl component, comprising:
      (A) an organopolysiloxane having the following average formula:

$R^2_d SiO_{(4-d)/2}$ wherein each $R^2$ is an independently selected substituted or unsubstituted alkyl group with the proviso that in one molecule, at least two of $R^2$ include ethylenic unsaturation and at least 20 mole percent (%) of all $R^2$ groups are methyl groups, and wherein d is selected such that $0.5 \leq d \leq 2.2$; and
      (B) an organohydrogenpolysiloxane having the following average formula:

$R^3_e H_f SiO_{(4-e-f)/2}$ wherein each $R^3$ is an independently selected substituted or unsubstituted alkyl group free from ethylenic unsaturation with the proviso that in one molecule, at least 20 mole percent (%) of all $R^3$ groups are methyl groups, and e and f are selected such that $1.0<e<2.2$; $0.002<f<1$; and $1.0<e+f<3.0$;
   wherein components (II)(A) and (II)(B) are present in the methyl component (II) in an amount to provide a mole ratio of silicon-bonded hydrogen atoms in (II)(B) to ethylenically unsaturated groups in (II)(A) of from 0.3 to 5; and
   (III) a hydrosilylation catalyst;
   wherein component (I) is present in said composition in an amount of from 0.15 to 21.0 weight percent based on the total weight of components (I) and (II).

2. The composition of claim 1, wherein: (i) when cured to give a cured product, the cured product exhibits diffusion of transmitted light when exposed to light; or (ii) component (I)(A) comprises a mixture, comprising:
   (A)(i) a substantially linear organopolysiloxane having average formula:

$R_{a'} SiO_{(4-a')/2}$ wherein each R and its provisos are defined above, and wherein a' is selected such that $1.9 \leq a' \leq 2.2$; and
   (A)(ii) a resinous organopolysiloxane having average formula:

$R_{a''} SiO_{(4-a'')/2}$ wherein each R and its provisos are defined above, and wherein a" is selected such that $0.5 \leq a'' \leq 1.7$; or (iii) both (i) and (ii).

3. A method of preparing the composition of claim 2, said method comprising:
   combining components (I)(A), (I)(B), (II)(A), (II)(B) and (III) to give the composition.

4. The method of claim 3, wherein components (I)(A) and (I)(B) are combined to give the (I) aryl component, components (II)(A) and (II)(B) are combined to give the (II) methyl component, the (I) aryl component and the (II) methyl component are combined to give the composition, and wherein the (III) hydrosilylation catalyst is: (i) present in the (I) aryl component; (ii) present in the (II) methyl component; (iii) combined with the (I) aryl component and (II) methyl component, or (iv) any combination of (i)-(iii); or wherein components (I)(A) and (I)(B) are mixed to give the (I) aryl component, components (II)(A) and (II)(B) are mixed to give the (II) methyl component, and wherein the (I) aryl component is disposed in the (II) methyl component.

5. A method of forming an article, said method comprising:
disposing a composition on a substrate to give a deposit; and
curing the deposit on the substrate to give the article;
wherein the composition is the composition of claim 2.

6. A method of preparing the composition of claim 1, said method comprising:
combining components (I)(A), (I)(B), (II)(A), (II)(B) and (III) to give the composition.

7. The method of claim 6, wherein components (I)(A) and (I)(B) are combined to give the (I) aryl component, components (II)(A) and (II)(B) are combined to give the (II) methyl component, the (I) aryl component and the (II) methyl component are combined to give the composition, and wherein the (III) hydrosilylation catalyst is: (i) present in the (I) aryl component; (ii) present in the (II) methyl component; (iii) combined with the (I) aryl component and (II) methyl component, or (iv) any combination of (i)-(iii); or wherein components (I)(A) and (I)(B) are mixed to give the (I) aryl component, components (II)(A) and (II)(B) are mixed to give the (II) methyl component, and wherein the (I) aryl component is disposed in the (II) methyl component.

8. A method of forming an article, said method comprising:
disposing a composition on a substrate to give a deposit; and
curing the deposit on the substrate to give the article;
wherein the composition is the composition of claim 1.

9. The method of claim 8, wherein: (i) curing the deposit comprises exposing the deposit to an elevated temperature for a period of time; (ii) the deposit comprises a wet film; (iii) said method further comprises preparing the composition prior to disposing the composition on the substrate; or (iv) any combination of (i)-(iii).

10. An article formed in accordance with the method of claim 9.

11. An article formed in accordance with the method of claim 8.

12. The article of claim 11 having a thickness of from greater than 0 to 2,000 micrometers (μm); or further defined as a light diffuser; or having a thickness of from greater than 0 to 2,000 micrometers (μm) and further defined as a light diffuser.

13. A lighting device comprising as a light diffuser the article of claim 11.

14. A method of diffusely transmitting light, said method comprising:
exposing a light diffuser to light, thereby diffusing transmitted light;
wherein the light diffuser is the article of claim 11;
optionally, wherein the light diffuser has a transmission at a wavelength of from 350 to 800 nanometers (nm) without cut-off.

* * * * *